United States Patent [19]

Stillie et al.

[11] Patent Number: 4,693,530
[45] Date of Patent: Sep. 15, 1987

[54] SHIELDED ELASTOMERIC ELECTRIC CONNECTOR

[75] Inventors: Donald G. Stillie; Paul D. Zakary, both of Winston-Salem, N.C.

[73] Assignee: AMP Incorporated, Harrisburg, Pa.

[21] Appl. No.: 912,707

[22] Filed: Sep. 29, 1986

[51] Int. Cl.$^4$ ............................................... H05K 1/00
[52] U.S. Cl. ....................................... 439/67; 439/493; 439/497; 439/92; 439/592
[58] Field of Search ............ 339/17 L, 17 LM, 17 M, 339/176 MF, 59, 61, 14 R, 14 P

[56] References Cited

U.S. PATENT DOCUMENTS

| | | | |
|---|---|---|---|
| 3,985,413 | 10/1976 | Evans | 339/17 LM |
| 4,057,211 | 11/1977 | Moore | 248/332 |
| 4,227,767 | 10/1986 | Mouissie | 339/176 MF |
| 4,552,420 | 11/1985 | Eigenbrode | 339/14 R |

FOREIGN PATENT DOCUMENTS

| | | | |
|---|---|---|---|
| 2036464 | 4/1980 | European Pat. Off. | 339/17 M |
| 2572856 | 5/1986 | France | 339/17 M |

*Primary Examiner*—Gil Weidenfeld
*Assistant Examiner*—David Pirlot
*Attorney, Agent, or Firm*—Eric J. Groen

[57] ABSTRACT

An electrical connector has two mounting base portions with a cylindrical portion extending therebetween. The cylindrical portion is wrapped with a film having a plurality of conductive signal traces disposed on the outer surface thereof for interconnecting corresponding circuitry on two substrates. The inner surface of the film includes a screen printed ground plane thereon for partially shielding the signal traces, thereby preventing crosstalk between lines on the printed circuit boards. The first end of the film is attached to the body and the film is wrapped around the body until the second end overlaps the first end, which commons the ground traces disposed on the outer surface of the film to the ground plane disposed on the inner surface of the film.

20 Claims, 6 Drawing Figures

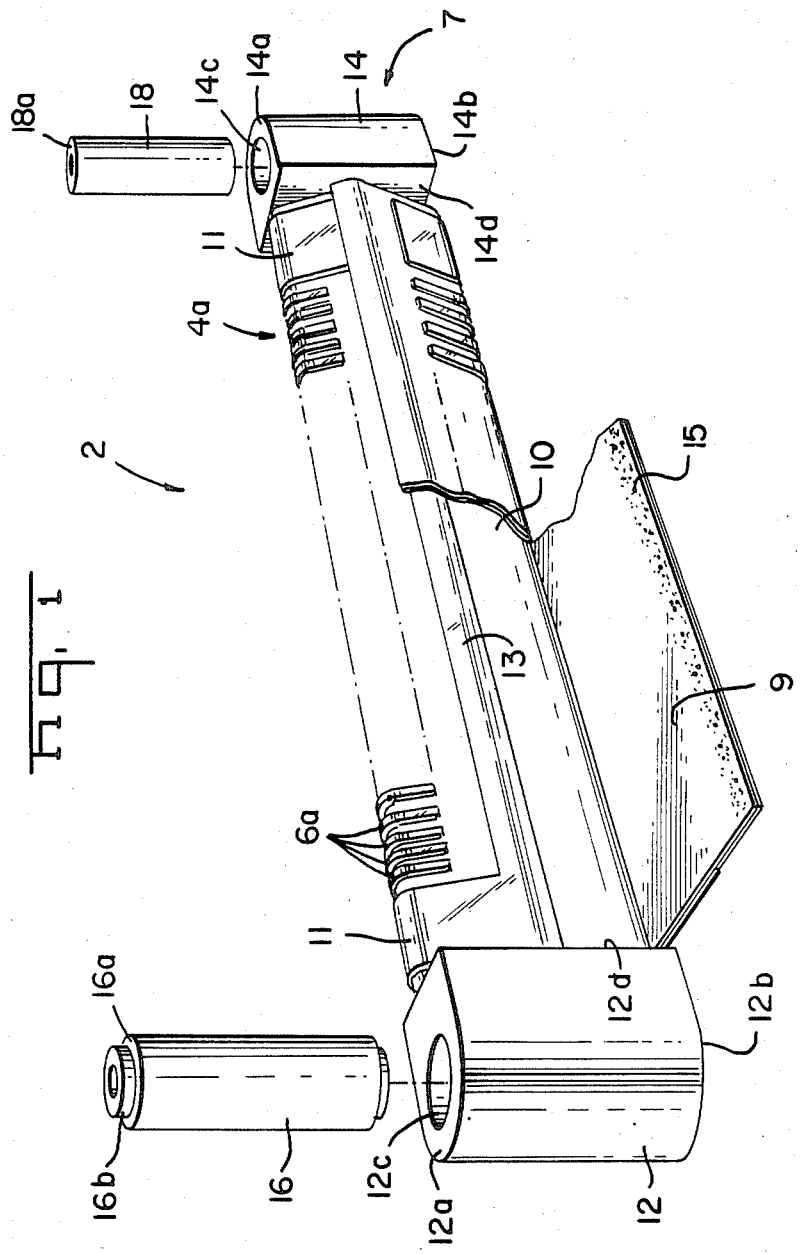

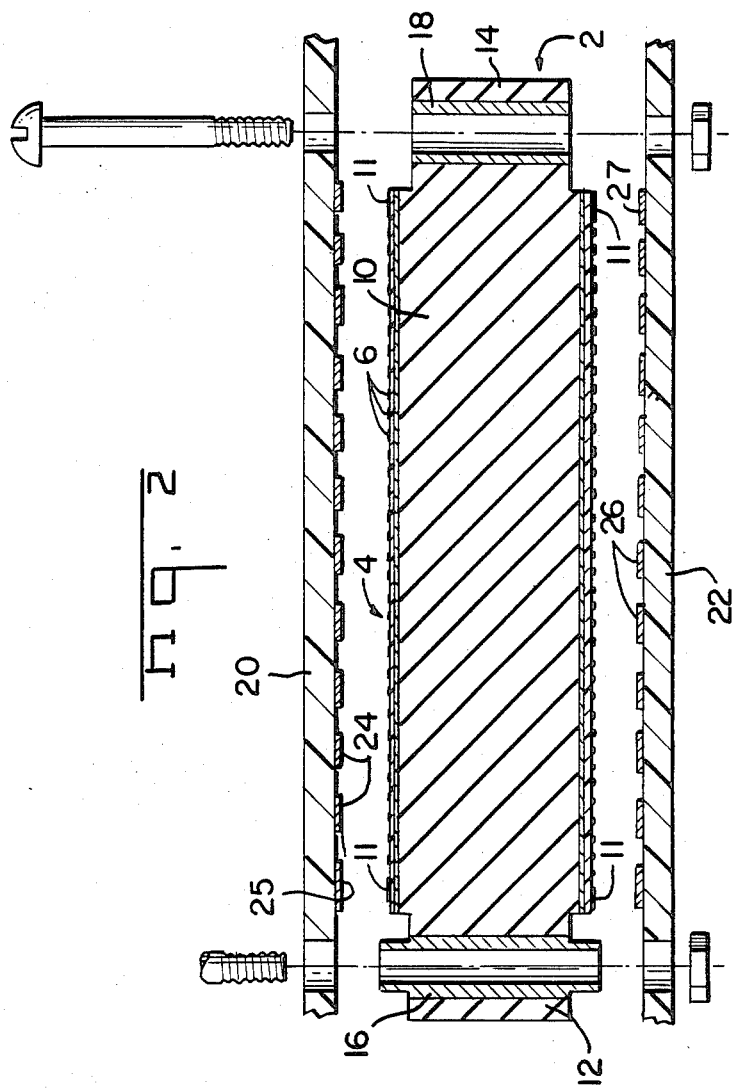

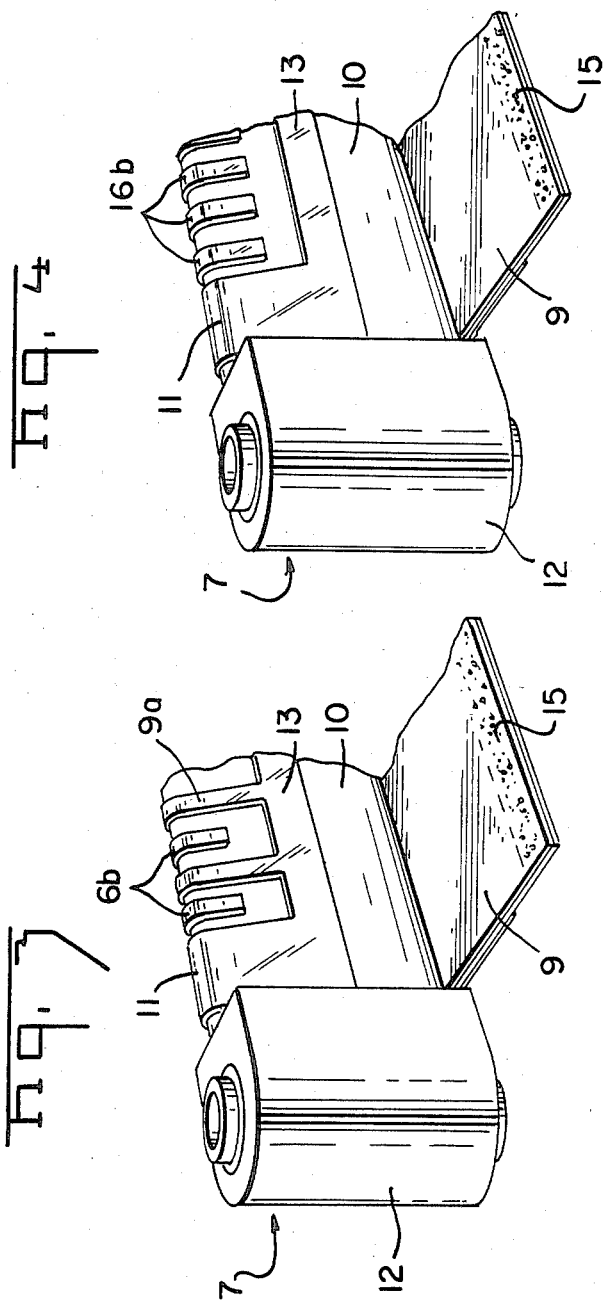

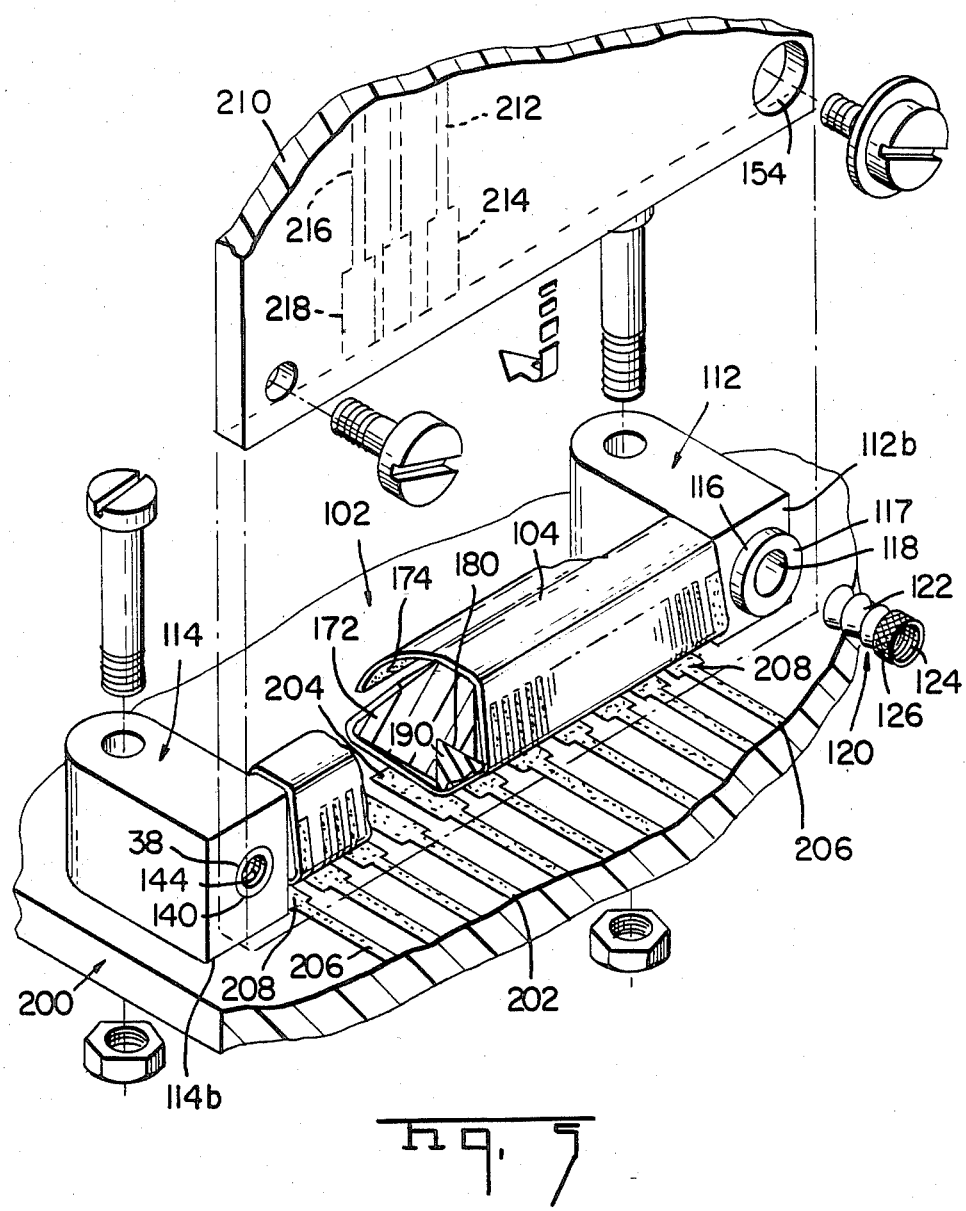

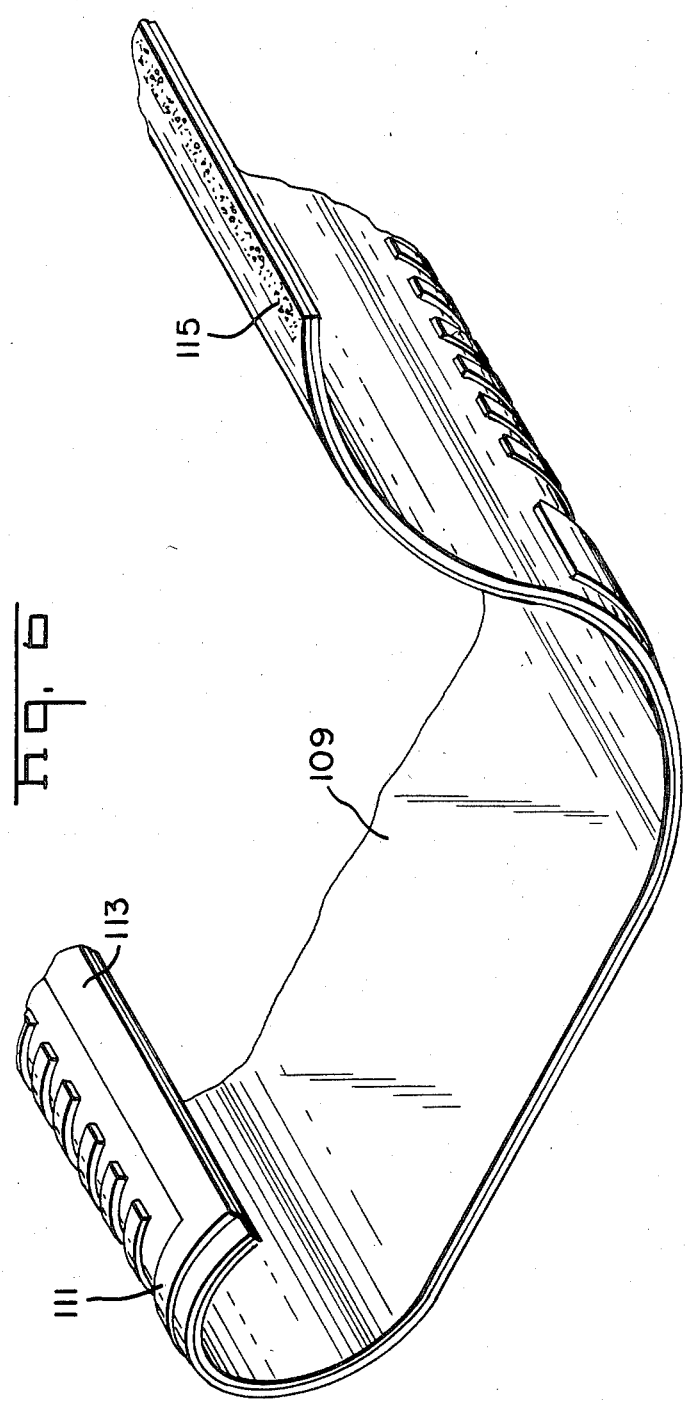

SHIELDED ELASTOMERIC ELECTRIC CONNECTOR

BACKGROUND OF THE INVENTION

1. Field of the Invention

This invention relates to a shielded electrical connector for interconnecting circuitry on a substrate and more particularly it relates to an electrical connector having an elastomeric body which can be positioned between two substrates such as printed circuit boards to interconnect corresponding aligned pads on the printed circuit boards.

2. Description of the Prior Art

U.S. Pat. No. 3,985,413 discloses a miniature unshielded electrical connector which can be positioned between spaced apart substrates, such as printed circuit boards to interconnect circuitry on each of the printed circuit boards. The connector consists of a generally cylindrical elastomeric body having a thin conventionally stable flexible film wrapped around the elastomeric body. Circuit traces are defined on the flexible film and face outwardly. When the elastomeric body is compressed between the two substrates or printed circuit boards, the elastomeric body supplies sufficient compressive force to establish an electrical connection with exposed pads on the printed circuit boards.

The electrical connector disclosed in U.S. Pat. No. 3,985,413 employs a film of polymeric material which is wrapped around the elastomeric body. The free ends of the film are joined together to maintain the film in surrounding relationship to the elastomeric body. The fim is not attached directly to the elastomeric body, thus permitting relative movement therebetween when the body is placed under compressive loads.

U.S. Pat. No. 3,985,413 only discloses the elastomeric connector and does not describe the manner in which that elastomeric connector is mounted to interconnect separate circuit components, such as printed circuit boards. In use, that miniature electrical connector must be positioned within an insulating housing which is in turn attached to the electrical components. When used to interconnect printed circuit boards, that miniature elastomeric connector is positioned within a longitudinally extending recess in an insulating housing and the insulating housing is attached directly to the printed circuit boards. Although the circuit traces on the exterior of that miniature electrical connector have a width less than the spacing of conventional contact pads on printed circuit boards, in order to prevent easy alignment, it is still necessary to rely upon the housing to position the connector relative to the printed circuit board.

One example of an unshielded electrical connector which was in part intended for interconnecting relatively widely spaced boards is disclosed in U.S. Pat. No. 4,057,211. That connector also employs a thin film having circuit traces disposed on its exterior and uses elastomeric members to establish contact pressure when the compressive force is applied thereto. The miniature electrical connector disclosed in that patent also employs a central rigid body having a trough-like recess in which the elstomeric members are positioned. The thin film circuitry is, however, positioned along the rigid body and is to be held in position by a plurality of elastomeric members spaced side by side in the common recess. It can be appreciated that the assembly costs encountered with elasteromeric connectors of more conventional construction would be magnified for the electrical connector shown in U.S. Pat. No. 4,057,211, at least in part because of the large number of separate parts which must be employed.

U.S. Pat. No. 4,552,420 discloses a right angled connector for interconnecting circuitry on perpendicularly mounted printed circuit boards. However, each conductive trace on the flexible dielectric of the connector corresponds to a respective circuit pad on either the mother board or daughter board. Thus, one given connector can only interconnect circuitry that is on the same centerline spacing as the centerline spacing of the conductive traces on the flexible material. A change in centerline spacing on the mother board or daughter board requires a different connector having a corresponding centerline spacing on the flexible material.

Also, the conductive traces on the film are laterally staggered and surrounding the film such that every other trace occupies a different portion of the film, as best shown in FIG. 3 of U.S. Pat. No. 4,552,420. As shown in FIG. 2 of U.S. Pat. No. 4,552,420, and referring to the connector as a right triangle, a first trace $30a$ is a short trace extending only around the right angled portion. The next trace $30b$ is laterally staggered from the first trace $30a$, and extends around the triangle from one perpendicular side to the other perpendicular side extending around the triangles hypotenuse.

The connector shown in U.S. Pat. No. 4,552,420 includes a means to control impedance, one method proposed is to include ground tracings on the inside surface of the film. In order to make a ground potential connection to the printed circuit boards, the ground tracings on the inside surface must be interconnected to the printed circuit boards. This is complicated by the fact that the film is densely filled with signal conduction paths disposed entirely around the film of the connector. One method proposed for making the ground potential connection between the ground traces and the circuit boards was to use some of the signal traces for signal return and interconnect the ground traces to those traces designated as signal returns, by means of a via.

SUMMARY OF THE INVENTION

The preferred embodiment of this invention comprises an electrical connector for interconnecting circuitry on at least one substrate to corresponding circuitry, either on a separate substrate or in a separate electrical component. The substrate has conductive elements such as contact pads disposed on one surface thereof as part of the circuitry on the substrate. These pads can be interconnected to conductive traces also located on the surface of the substrate or printed circuit board. Alternatively these pads can be interconnected to other circuitry on the substrate, such as circuits on a multilayer printed circuit board in which the circuits are positioned between insulating layers. The electrical connector has a body which is formed of elastomeric material such as silicone rubber. The body has at lest onen cylindrical proportion which is integral with base portions on either end of the cylindrical portion. In one embodiment of this invention, the cylindrical portion has a diamond shaped cross section. A pair of support members can be inserted in engagement with each base member. The support members comprise annular sleeves which are inserted in companion bores in the elastomeric base members. The bores extend perpendicular to the axis of the cylindrical portion of the body. Each support member or sleeve has a height which is less than the undeflected height of the cylindrical body portion. When a compressive force is applied to the cylindrical body portion, for example, when two printed circuit boards are secured together and spaced apart by a distance less than the undeflected height of the cylindrical body portion, the support members act as a stop to limit the amount of compressive force applied. Each support member engages each of the oppositely positioned printed circuit boards in this configuration.

Electrical contact is established by a plurality of conductors or conductive traces disposed on the surface of the cylindrical body portion. These conductors are defined on the exterior of a polymeric film which surrounds and is adhered to the cylindrical body portion. The conductors can be disposed in registry with the conductive elements or conductive pads on the substrate or on the substrates. Proper alignment between the conductors is maintained by engagement of one or more of the support members or sleeves with each substrate. For example, a sleeve having an upwardly projecting surface can be inserted into a hole on the printed circuit board. A separate abutting surface below the upwardly projecting surface on the sleeve can engage the face of the printed circuit board to prevent further compression being applied to the elastomeric body.

Another embodiment of the invention comprises an electrical connector in a mother-daughter board configuration, the connector secured to the mother board and the daughter board secured to the connector. The electrical connector has a body which is formed of a plastic material having at least one cylindrical portion which is integral with the bse portions on each end of the cylindrical portion. In the preferred embodiment of this invention, the cylindrical portion has a trapezoidal cross section. On at lest one location of the connector, preferably on the base portion, is included an alignment boss which mates with a hole in the circuit board which aligns the circuit paths on the mother board with the circuit paths on the daughter board.

The preferred embodiment of the invention also includes an insert-receiving cavity, the insert being made of an elastomeric material. In the preferred embodiment, the elastomeric insert is triangular in cross section having adjacent sides long than the mating sides in the insert-receiving cavity. Thus, a portion of the insert corner or node protrudes beyond the adjacent face. The insert is designed for perpendicularly mounted printed circuit boards and has the ability to produce a normal force on each of the perpendicularly mounted boards, using a single insert.

The preferred embodiment of the invention then includes a polymeric film having conductive traces disposed on the surface of the film, the film being wrapped around the insert and the body portion, and affixed to the body portion. The conductive traces on the film are disposed on the film with a much smaller center line than the conductive paths on the printed circuit boards. The conductors can be disposed in registry with the conductive elements or conductive paths on the substrate or on the substrates.

Each of the embodiments, parallel or perpendicular mount, includes a shielding means. The preferred embodiment would include two ground traces along the perimeter of the film flanking the conductive traces and parallel thereto. A ground bus portion then extends along the first end of the film on the outside surface of the film. The conductive traces only partially surround the film such that they do not contact the ground bus portion. The film is wrapped around the connector body until the second end of the film overlaps the first end of the film, thereby commoning the shielding means disposed on the inside surface with the grounding bus, and therefore the grounding traces. The preferred embodiment of the connector would also include flexible conductive adhesive adhering the first and second ends together.

BRIEF DESCRIPTION OF THE DRAWINGS

FIG. 1 is a perspective view of a one-piece elastomeric connector in accordance with a first embodiment of this invention.

FIG. 2 is across sectional view through lines 2—2 of FIG. 1.

FIG. 3 is an alternate embodiment of the signal traces showin a ground-signal-ground configuration.

FIG. 4 is an alternate embodiment of the siganl traces showing dedicated traces for the circuitry on the substrates.

FIG. 5 is a perspective view of the connector in the perpendicular mouont configuration.

FIG. 6 is a perspective view similar to FIG. 5 showing the film partially broken away to expose the interior of the film.

DETAILED DESCRIPTION OF THE PREFERRED EMBODIMENTS

The instant invention relates to a shielded electrical connector for interconnecting the circuitry of two printed circuit boards. The subject invention can be profiled for use with mounting and interconnecting either parallel boards or alternatively can be profiled for mounting and interconnecting perpendicular boards, a mother and daughter board for example.

The preferred embodiment of the electrical connector of this invention profiled for mounting parallel printed circuit boards is shown in FIG. 1. The preferred embodiment comprises a one-piece elastomeric body consisting of a cylindrical central portion 10 and base portion 12 and 14 on either end. the elastomeric body 7 comprises a one-piece molded silicone rubber body. A flexible film subcomponent includes an insulative film having a plurality of conductive traces defined on the exterior thereof, which is positioned in surrounding relationship to the central cylindrical portion 10 of the elastomeric body. The central insulative film can comprise any of a number of conventional polymeric films such as a polyimide-amide film. The conductive traces 6 can comprise etched metallic traces such as etched copper traces deposited on the exterior of the film or can comprise conductive ink traces screen printed onto the exterior of the film. The film conductor laminate can also be fabricated in a conventional manner by casting a polymeric film onto one surface of a conductive sheet and then selectively etching the conductor 6. The interior of the flexible film includes a ground plane disposed thereon for shielding the conductive traces for high speed applications.

As shown in FIG. 4, the connector assembly 2 comprising the film-connector laminate 4 and the elstomeric body 7 are adapted to be directly mounted to one or more substrates such as printed circuit boards 20 and 22. The conductor 2 does not require the use of a separate insulating housing for mounting the connector to the printed circuit boards. Referring now to FIG. 1, the one-piece molded elastomeric body 7 includes a central cylindrical portion 10 with integral elastomeric base members 12 and 14 extending outwardly from the cylindrical body portion 10.

Each of the bases 12 and 14 extending outwardly from the cylindrical body portion 10 has a cylindrical bore extending completely therethrough from an upper face 12a to a lowr face 12b, respectivly and through upper face 14a and lower face 14b in base 14. The bore 12c extends generally perpendicular to the axis of the cylindrical body portion 12. The cylindrical body portion 10 joins the integral base members 12 and 14 at internally directed faces 12b and 14b which can serve to position the film-conductor substrate 4 around the central body portion 10. Since the entire elastomeric body 7 is formed by a single molding, the outwardly extending base members 12 and 14 are formed of the same material as the central cylindrical body portion 10 to form a unitary elastomeric structure 7. As shown most clearly in FIG. 2, the height of the cylindrical body portion 10, which in the preferred embodiment has a diamond-shaped cross section, is greater than the height of base members 12 and 14 when mesured from between the upper and lower surfaces 12a and 12b or 14a and 14b respectively.

Support sleeves 16 and 18 formed of a material which is substantially more rigid than the elastomeric material forming body 7 are dimensioned to be received within the bores 12c and 14c respectively. Each of the sleeves 16 and 18 comprise a generally annular member having axially facing shoulders 16a and 16b, or 18a and 18b adjacent opposite ends thereof. These end surfaces 16a and 16b or 18a and 18b are adapted to engage surface of the substrate or the printed circuit boards as will be described in more detail subsequently. Annular support sleeve 16 differs from annular support sleeve 18 in that a separate annular surface or extension 16c is formed axially outwardly from axially facing surface 16a. A similar surface 16d extends outwrdly from axially facing surface 16b. Annular surfaces 16c and 16d have an outer diameter less than the outer diameter of the sleeve 16 along the greater portion of its length. These annular surfaces 16c and 16d are dimensioned for receipt in holes in a printed circuit board and serve to precisely position the connector assembly relative to the printed circuit board or other substrate.

It will be appreciatd that the support sleeves 16 and 18 not only serve to position the connector but also provide a stop to limit the amount of compressive load which can be applied to the connector. Surface 16a, 16b, 18a and 18b serve to engage the inwardly facing surfaces of the printed circuit boards 20 and 22 to prevent continued compression of the elastomeric member. The fastening members such as bolts and nuts conventionally attach the boards 20, 22 to the connector and serve to maintain a compressive load on the elastomeric connector 2, but they cannot be used to apply excessive compressive loads which might lead to deterioration of the elastomer. In this manner the loads applied to the elastomer can be regulated to essentially the design criteria.

The film-conductor laminate which serves as the actual interconnect between substrates, is positioned in surrounding relationship to the cylindrical body portion 10. The preferred embodiment as shown in FIG. 1 includes conductive traces 6a on the film laminate defined such that a plurality of the traces 6a will contact each pad of a corresponding pair of conductor pads 24, 26. Although the conductive pads 24, 26 on the printed circuit boards to be interconnected must have have equal centerline spacings and must be laterally aligned, with a plurality of conductive traces 6a on the film substrate 4 dedicated to a single conductor pad 24, 26 on the printed circuit boards, the connector 2 may be utilized for interconnecting conductive pads on substrates regardless of the centerline spacing of the conductor pads on the pair of interconnected substrates. In this configuration, the traces 6a are not dedicated to specific traces on the printed circuit boards but rather redundantly contact the traces on the boards, as more fully disclosed in assignee's pending patent application Ser. Nos. 846,325 filed Mar. 31, 1986 and Ser. No. 741,650 filed June 5, 1985.

In the preferred embodiment of the invention then, a typical flexible film substrate 4 has conductive traces 0.0025 inches wide on 0.005 inch centerlines, or 0.003 inches wide on 0.007 inch centerlines, although other widths and spacings of conductive tracings 6a are possible. A typical printed circuit board has 0.025 inch wide conductive pads on 0.050 inch centerlines, but could also be 0.025 inch wide on 0.100 inch centerlines. The preferred embodiment of the subject connector can accommodate any centerline spacing on each combination of printed circuit boards, provided the conductive pads on the boards are laterally aligned.

As shown in FIG. 1, the film 4 futher includes a ground plane 9 disposed on the inner surface thereof. This ground plane shields the radiation given off during the high speed transmission of signals, and prevents this radiation from interfering with other signals, i.e. crosstalk. The preferred embodiment of the connector includes a layer of silver ink screen printed on the bck side of the film. This screen printed ink results in a very inexpensive method of shielding, has a very high conductivity and allows the film to retain its original flexibility. The screen printable inks used as a method of shielding is disclosed more fully in Asignee's pending U.S. patent application Ser. No. 755,748, filed July 18, 1985, the disclosure of which is incorporated herein by reference. An important feature of the sceen printable ink is that the ink is graphically printable allowing any graphic design to be printed to the back side of the film. For example, if desireable, the ink could be printed in such a configuration as to match the impedance of the conductive traces on the film with the impedance of the circuitry on the printed circuit boards, thereby preventing reflection of signals.

In order to common the ground shield 9 on the board to ground traces 25, 27 located on the printed circuit boards 20, 22 respectively, the ground plane 9 must be electrically connected to the outer surface of the film 4 for interconnection to the boards. In the preferred embodiment of this invention, a first end 8a of the insulative film 8 is attached to one face of the cylindrical body portion 10 by a conventional adhesive extending along the length of leading edge 8a. The other end may then be attached to the first end in an overlapping relationship as shown in FIG. 1 by a conductive adhesive 15. The overlapping of the film 4 interconnects the inner surface, and more specifically, the ground plane 9 to the outer surface of the film. Conveniently then, the outer surface of the film, at the location of the overlap includes a bus portion 13 which, in turn, is continuous with a ground trace 11 which extends around the perimeter of the outer surface of the film, and can be used as an interconnection to the ground traces 25, 27 on the printed circuit boards 20, 22 just as traces 6a are used to interconnect to the signal lines or traces 24, 26 on the printed circuit boards 20, 22. In the preferred embodiment of the invention the signal traces 6a, the bus portion 13 and the ground trace 11 are all etched from a copper plated film. Thus the preferred embodiment of the connector can be used to interconnect two parallel mounted printed circuit boards having any spacing or profile of conductive signal pads provided the signal pads on the boards are laterally aligned with each other, and provided the ground pads on the board are spaced to match the ground traces 11 located on the connector.

The geometrical configuration of the conductive traces can also be altered depending on the needs of the interconnection system. For example as shown in FIG. 4, the connector can include a plurality of side-by-side conductors 6b disposed on the surface of the film, each conductor being spaced as, and dedicated to a specific line 24, 26 on a printed circuit. Referring to FIG. 3, the conductors on the outer surface of the film can also be configured as ground-signal-ground increasing the shielding capability between adjacent signal paths on the film. In the configurations shown in FIGS. 2 and 3, the conductor lines 6a and the ground traces 9a are each dedicated to corresponding lines on the printed circuit boards.

Each base 12 and 14 has an inwardly facing planar surface, 12d and 14d respectively, to which the film should be aligned. With the film-conductor laminate thus aligned in this manner, the individual conductive traces will be aligned to contact oppositely facing aligned conductor pads, such as aligned pads 24 and 26. The conductive traces may be defined such that a plurality of conductors will contact each pad as with the connector disclosed in U.S. Pat. No. 3,985,413. However, the film conductor laminate 4 is aligned with surfaces 12d and 14d, nd the elastomeric body is aligned with the printed circuit board by keyed support member 16. Therefore, the conductors 6a or 6b on film 8 can be individually aligned with conductor pads 24 and 26.

In the preferred embodiment of this invention, the insulating film 8 is not attached to the cylindrical body portion 10 along its entire surface. As shown in FIG. 4, relative movement between the elastomeric body 10 and the film 8 is provided such that the film 8 need not deflect in the same manner as the elastomer, and relative movement can occur between the film and the elastomer and the application of compressive loads. This reduces the stresses placed upon the adhesive and upon both the flexible film and the elastomer.

Another embodiment of the electrical connector, for perpendicularly mounting two printed circuit boards as shown in FIG. 5, comprises a body molded of a plastics material, such as Valox, a registered trademark of the General Electric Company, the body consisting of a cylindrical central portion 172 and base portions 112 and 114 on either end. the connector central body portion 172 has an insert-receiving recess 180 for receiving insert 190. The flexible film 104 has conductive traces 106 thereon, and is wrapped around the central body portion 172 and insert 190, and is secured to the body portion 172. The connector has two base portions 112 and 114 molded integrally with the central body portion 172, and has means for attaching the connector to a mother board 200. The connector base portions 112, 114 further comprise means for attaching a daughter board 210 to the connector. The central insulative film can, as before, comprise any of a number of conventional polymeric films such as a polyimide-amide film.

Extending between body portions 112 and 114 is a cylindrical portion of trapezoidal configuration. The cylindrical portion further includes an insert receiving cavity for receiving therein an insert 190. The configuration of the cylindrical portion and the insert is shown in greater detail in aforementioned patent application Ser. No. 846,325.

The film conductor laminate 104 which serves as the actual interconenct between substrates, is then positioned in surrounding relationship to the cylindrical body portion 172. In the preferred embodiment of this invention, a first end 108a of the insulative film 108 is attached to one face of the cylindrical body portion 172 by conventional adhesive extending along the length of leading edge 108a. The opposite edge 108b is then attached to the exterior of the edge 108a, using a conductive adhesive to electrically interconnect the ground shield with the ground trace 113. The film conductor laminate is aligned such that the conductive traces are perpendicular disposed relative to the axial centerline of the cylindrical body portion 172. With the film conductor laminate aligned in this manner, the individual conductive traces will be aligned to contact oppositely facing aligned conductor pads, such as aligned paths 204 and 214, on perpendicularly mounted printed circuit boards, as shown in FIG. 5.

In the preferred embodiment of the invention, the conductive traces on the film laminate are defined such that a plurality of traces will contact each conductor pad. Although the conductive pads on the mother and daughter board must have equal centerline spacings, with a plurality of conductive traces on the film substrate dedicated to a single conductor pad on the printed circuit board, the connector may be utilized for interconnecting conductive pads on substrates regardless of the centerline spacing of the conductor pads on the pair of interconnected substrates. All that is required to interconnect the substrates is that the conductive pads on the mother board and the daughter board are laterally aligned.

In the preferred embodiment of this configuration then, a typical flexible film substrate 104 has conductive traces 0.0025 inches wide on 0.005 inches centerlines, or 0.003 inches wide on 0.007 inch centerlines, although other widths and spacings of conductive traces are possible. A typical printed circuit board has 0.025 inch wide conductive pads on 0.050 inch centerlines, but could also be 0.025 inches wide on 0.100 inch centerlines. The subject connector can accommodate any centerline spacing on each combination mother-daughter board, provided the conductive pads on the printed circuit boards are laterally aligned. It should be understood that if desireable, as shown in FIG. 4, the conductive traces 106 could be individually dedicated to a single line on the printed circuit board or could be profiled in a ground-signal-ground configuration as shown in FIG. 3.

Similar to the flexible film of the previous embodiment, the present embodiment includes a shielding trace 109 on the inner surface of the polymeric film. when the film is in place against the back surface 174, conductive adhesive 115 overlapping contacts the ground trace 113 which is in turn commoned to the trace 111. When in place on the printed circuit boards, the individual traces 106 interconnect the traces 202, 212 from the mother to daughter board and the ground traces 113 on the perimeter of the film commons the ground shield 109 on the inner surface to a ground potentials on the mother 200 and daughter 210 board.

In the preferred embodiment of this invention, the insulating film 108 is not affixed to the cylindrical body portion 172 along its entire surface, that is, relative movement between the plastic body 172 and the film 108 is provided such that the film 108 need not deflect in the same manner as the elastomer insert 190, and relative movement can occur between the film and the insert during the application of compressive loads. This reduces the stresses placed upon the adhesive and upon both the flexible film and the elastomer.

The elastomeric insert 190 and the insert nodes 196 and 198 assure good contact between the conductive paths 106 and the conductive pads 214 and 204 for the electrical interconnection. When the connector is secured to the printed circuit board by means of bolts and nuts, the nodes of the insert 190 are deformed inwardly and the resiliency in the elastomeric insert 190 produces a normal force on the backside of the film 104 forcing the conductive traces 106 outwradly against the conductive pad. Likewise, when the daughter board is secured to the connector by means of screws, the elastomeric insert 190 produces a normal force on the backside of the conductive film 104 forcing the conductive traces 106 outwardly against the conductive pads. When the connector 102 is securely attached to the mother board and the daughter board is securely attached to the connector, the insert nodes conform to the respective planes of the cylindrical portion, the elastic deformation of the nodes producing a continuous normal force of the film 104 against the respective printed circuit boards.

What is claimed is:

1. An electrical connector for interconnecting circuitry on a first substrate to circuitry on a second substrate, the connector comprising a body portion and a film assembly, the body portion including means to mount the substrates to the connector; the film assembly including an insulative film having an inside and an outside surface, the film having a plurality of conductive signal traces and at least one ground trace disposed on the outside surface of the the film, said signal and ground traces on said film being profiled to interconnect signal and ground traces of said first and second substrate, and a grounding means disposed on the inside surface of the film thereof, a first end of the film being placed against the body portion with the inside surface facing the body portion, the film being wrapped around the body portion until at least a portion of a second end of the film overlaps the first end, thereby commoning the grounding means with the grounding trace.

2. The connector of claim 1 wherein the conductive signal traces on the outside surface of the film are profiled to redundantly contact signal traces which make up the circuitry on the first and second substrates.

3. The connector of claim 1 wherein the connector is profiled for interconnecting two printed circuit boards arranged in a perpendicular configuration.

4. The electrical connector of claim 1 wherein the conductive signal traces are disposed on the outside surface of the film to only partially surround the film intermediate the ends thereof.

5. The connector of claim 4 wherein a ground bus portion is disposed on the outside surface of the film at the first end extending transversely of the conductive signal traces, said bus portion interconnecting the ground trace disposed on the outside surface thereof.

6. The connector of claim 5 wherein the conductive signal traces, the ground traces and the grounding bus portion are formed by selectively etching plated copper from insulative film.

7. The connector of claim 1 wherein the conductive signal traces on the outside surface of the film are profiled to each contact a dedicated signal trace which make up the circuitry on the first and second substrates.

8. The connector of claim 7 further comprising a ground trace disposed between each consecutive signal trace, the ground traces commoned to a grounding bus.

9. The connector of claim 1 wherein the ground means is screen printed silver ink deposited to the inside surface of the film.

10. The connector of claim 9 wherein the ground means on the inside surface is a continuous plane totally covering the inside surface of the film.

11. The connector of claim 9 wherein the ground means on the inside surface of the film is graphically printed to match the impedance of the signal traces on the outside surface of the film with the impedance of the circuitry on the first and second substrates.

12. The connector of claim 1 further comprising means to conductively connect the second end of said film to the first end of said film, commoning said ground means and said at least one trace.

13. The connector of claim 12 wherein the conductive means comprises conductive adhesive applied to the outside suface of the first end adhering to the inside surface of the second said end.

14. The connector of claim 1 wherein the body portion comprises base portions having a cylindrical portion extending therebetween.

15. The connector of claim 14 wherein the connector is profiled for interconnecting parallel printed circuit boards.

16. The connector of claim 14 wherein the cylindrical portion is generally triangular in cross section.

17. The connector of claim 15 wherein the body portion comprises a one-piece molded elastomeric body.

18. The connector of claim 17 wherein the cylindrical portion is generally diamond shaped in cross section having nodal points as part of the elastomeric body extending above the base portions, the nodal points being profiled to resiliently bias the film against the circuitry when the substrates are fixed to the connector.

19. The electrical connector of claim 17 wherein the cylindrical member includes resilient means disposed beneath said film assembly and oriented to provide a normal force electrical contact between the signal and ground traces on the film and the circuitry on the first and second substrates.

20. An electrical connector for interconnecting circuitry on a first substrate to corresponding circuitry on a second substrate, the connector comprising a body portion and an elastomeric film surrounding the body portion, the film comprising an inside surface and an outside surface, the film having a plurality of conductive signal traces laterally disposed on the outside surface thereof for interconnecting respective signal pads on the first and second substrates, the connector being characterized in that:

the film includes at least one ground trace disposed on the inside surface thereof and at least one ground trace disposed on the outside surface thereof for interconnection to ground pads of said circuitry disposed ont he first and second substrates, the film is affixed to the body portion at a first end and surrounds the body portion until a second end overlaps the first end, said inside trace being commoned to said at lest one outside trace when said second end overlaps said first end, the film further comprising means for conductively adhering the second end and first end together keeping the first and second traces electrically commoned.

* * * * *